(12) United States Patent
Jin et al.

(10) Patent No.: US 11,158,737 B2
(45) Date of Patent: Oct. 26, 2021

(54) LDMOS COMPONENT, MANUFACTURING METHOD THEREFOR, AND ELECTRONIC DEVICE

(71) Applicant: CSMC TECHNOLOGIES FAB2 CO., LTD., Jiangsu (CN)

(72) Inventors: Huajun Jin, Wuxi (CN); Guipeng Sun, Wuxi (CN); Hongfeng Jin, Wuxi (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 0 days.

(21) Appl. No.: 16/644,856

(22) PCT Filed: Aug. 3, 2018

(86) PCT No.: PCT/CN2018/098447
§ 371 (c)(1),
(2) Date: Mar. 5, 2020

(87) PCT Pub. No.: WO2019/024906
PCT Pub. Date: Feb. 7, 2019

(65) Prior Publication Data
US 2020/0220010 A1   Jul. 9, 2020

(30) Foreign Application Priority Data

Aug. 4, 2017 (CN) .......................... 201710660988.8

(51) Int. Cl.
*H01L 29/78* (2006.01)
*H01L 29/66* (2006.01)

(52) U.S. Cl.
CPC .... *H01L 29/7816* (2013.01); *H01L 29/66689* (2013.01)

(58) Field of Classification Search
CPC ........... H01L 29/7816; H01L 29/66689; H01L 29/402; H01L 29/7835; H01L 29/66659;
(Continued)

(56) References Cited

U.S. PATENT DOCUMENTS

2006/0261378 A1   11/2006   Moscatelli et al.
2009/0166765 A1    7/2009   Lee
(Continued)

FOREIGN PATENT DOCUMENTS

CN     1639875     7/2005
CN   101477952    7/2009
(Continued)

OTHER PUBLICATIONS

International Search Report and Written Opinion issued for International Patent Application No. PCT/CN2018/098447, dated Nov. 8, 2018, 12 pages including English translation.

*Primary Examiner* — Mohammed R Alam
(74) *Attorney, Agent, or Firm* — Hamre, Schumann, Mueller & Larson, P.C.

(57) ABSTRACT

Provided in the present invention are an LDMOS component, a manufacturing method therefor, and an electronic device, comprising: a semiconductor substrate (100); a drift area (101) provided in the semiconductor substrate; a gate electrode structure (103) provided on a part of the surface of the semiconductor substrate and covers a part of the surface of the drift area; a source electrode (1052) and a drain electrode (1051) respectively provided in the semiconductor substrate on either side of the gate electrode structure, where the drain electrode is provided in the drift area and is separated from the gate electrode structure; a metal silicide barrier layer (106) covering the surface of at least a part of the semiconductor substrate between the gate electrode structure and the drain electrode; and a first contact hole (1081) provided on the surface of at least a part of the metal silicide barrier layer.

16 Claims, 5 Drawing Sheets

(58) Field of Classification Search
CPC ............... H01L 29/665; H01L 29/0603; H01L 29/0611; H01L 29/66477
See application file for complete search history.

(56) References Cited

U.S. PATENT DOCUMENTS

| | | | |
|---|---|---|---|
| 2011/0012267 A1* | 1/2011 | Depetro | H01L 21/76897 257/773 |
| 2013/0020632 A1* | 1/2013 | Disney | H01L 29/66659 257/328 |
| 2013/0277741 A1 | 10/2013 | Guowei et al. | |
| 2016/0149007 A1* | 5/2016 | Chou | H01L 29/402 257/339 |

FOREIGN PATENT DOCUMENTS

| | | |
|---|---|---|
| CN | 204102905 | 1/2015 |
| CN | 104867974 | 8/2015 |
| CN | 105789280 | 7/2016 |
| CN | 106257630 | 12/2016 |
| CN | 106972052 | 7/2017 |

* cited by examiner

FIG. 1G providing a semiconductor substrate with a drift region formed therein, forming a gate structure on part of a surface of the semiconductor substrate with the gate structure covering part of a surface of the drift region, and forming a source and a drain in the semiconductor substrate respectively on opposite sides of the gate structure, the drain being disposed in the drift region and spaced from the gate structure — S1 forming a metal silicide barrier layer covering at least part of the surface of the semiconductor substrate between the gate structure and the drain — S2 forming a first contact hole on at least part of a surface of the metal silicide barrier layer — S3

LDMOS COMPONENT, MANUFACTURING METHOD THEREFOR, AND ELECTRONIC DEVICE

TECHNICAL FIELD

The present disclosure relates to the field of semiconductor technology, and particularly, to a laterally diffused metal oxide semiconductor (LDMOS) device, a manufacturing method therefor and an electronic apparatus.

BACKGROUND

A length of polysilicon is usually expanded in a conventional high voltage device to a field plate oxide layer of a drift region, which makes the polysilicon act as a filed plate. The field plate depletes the drift region to form a depletion layer, which increases the width of the lateral depletion layer and further a withstand voltage (i.e. breakdown voltage). Meanwhile, it is necessary to select a suitable field plate oxide layer thickness between the drain and the gate in the drift region of the high voltage device, and the required field plate oxide layer thickness is either a single thickness or obtained through parasitic oxide (for example, a shallow trench isolation (STI) structure in a drift region between the drain and the gate). Although the use of STI can improve the withstand voltage of the device, the on-resistance of the device is also increased.

Therefore, under the premise of ensuring the withstand voltage of the device, how to reduce the on-resistance as much as possible is an urgent problem to be solved.

SUMMARY

According to embodiments of the present disclosure, an LDMOS device, a manufacturing method therefor and an electronic apparatus are provided.

An LDMOS device includes a semiconductor substrate; a drift region disposed in the semiconductor substrate; a gate structure disposed on part of a surface of the semiconductor substrate and configured to cover part of a surface of the drift region; a source and a drain respectively disposed in the semiconductor substrate on opposite sides of the gate structure, the drain being disposed in the drift region and spaced from the gate structure; a metal silicide blocking layer configured to cover at least part of the surface of the semiconductor substrate between the gate structure and the drain; and a first contact hole disposed on at least part of a surface of the metal silicide blocking layer.

A manufacturing method for an LDMOS is further provided, which includes:

providing a semiconductor substrate with a drift region formed therein, forming a gate structure on part of a surface of the semiconductor substrate with the gate structure being configured to cover part of a surface of the drift region, and form a source and a drain in the semiconductor substrate on opposite sides of the gate structure respectively, the drain being disposed in the drift region and spaced from the gate structure;

forming a metal silicide blocking layer configured to cover at least part of the surface of the semiconductor substrate between the gate structure and the drain; and forming a first contact hole on at least part of a surface of the metal silicide blocking layer.

An electronic apparatus is further provided which includes any of the foregoing LDMOS devices.

Details of one or more embodiments of the disclosure are set forth in the accompanying drawings and description below. Other features, objects, and advantages of the disclosure will become apparent from the description, the drawings, and the claims.

BRIEF DESCRIPTION OF THE DRAWINGS

In order to better describe and illustrate embodiments and/or examples of those inventions disclosed herein, references may be made to one or more drawings. The additional details or examples used to describe the drawings should not be considered as limiting the scope of any of the disclosed inventions, the presently described embodiments and/or examples, and the best mode of these inventions as currently understood.

DETAILED DESCRIPTION

In order to facilitate understanding of the present disclosure, the present disclosure will be described in details with reference to the accompanying drawings. The drawings show preferred embodiments of the disclosure. However, the present disclosure can be implemented in many different forms and is not limited to the embodiments described herein. Rather, these embodiments are provided so that this disclosure will be more thorough and comprehensive.

Unless otherwise defined, all technical and scientific terms used herein have the same meanings as commonly understood by one of ordinary skill in the art to which this invention belongs. The terms used herein in the description of the invention are for the purpose of describing particular embodiments only and are not intended to limit the invention. The term "and/or" as used herein includes any and all combinations of one or more of the associated listed items.

In order to thoroughly understand the present invention, detailed steps and structures will be provided in the following description in order to explain the technical solution proposed by the present invention. The preferred embodiments of the present invention are described in detail below. However, in addition to these detailed descriptions, the present invention may have other embodiments.

In order to solve the foregoing technical problems, the present disclosure provides an LDMOS device. The LDMOS device mainly includes: a semiconductor substrate; a drift region disposed in the semiconductor substrate; a gate structure disposed on part of a surface of the semiconductor substrate and configured to cover part of a surface of the drift region; a source and a drain respectively disposed in the semiconductor substrate on opposite sides of the gate structure, the drain being disposed in the drift region and spaced from the gate structure; a metal silicide blocking layer configured to cover at least part of the surface of the semiconductor substrate between the gate structure and the drain; and a first contact hole disposed on at least part of a surface of the metal silicide blocking layer.

In summary, the LDMOS device of the present disclosure includes a metal silicide blocking layer configured to cover at least part of a surface of the semiconductor substrate between a gate structure and a drain, and a first contact hole disposed on at least part of a surface of the metal silicide blocking layer. Therefore, the depletion of the drift region is enhanced to increase the breakdown voltage of the device, thereby improving the performance of the device. In addition, there is no need for the LDMOS device of the present disclosure to provide any shallow trench isolation in the drift region of the drain, thereby greatly reducing the on-resistance of the device.

Embodiment I

The LDMOS device of the present disclosure will be described with reference to FIG. 1G herein.

As an example, the LDMOS device of the present disclosure includes a semiconductor substrate 100. The semiconductor substrate 100 can be made of undoped monocrystalline silicon, doped monocrystalline silicon, silicon on insulator (SOI), stacked silicon on insulator (SSOI), stacked silicon germanium on insulator (S—SiGeOI), silicon germanium on insulator (SiGeOI), and germanium on insulator (GeOI). As an example, in the present embodiment, the composition material of the semiconductor substrate 100 is monocrystalline silicon.

The semiconductor substrate 100 can also be a P-type semiconductor substrate or an N-type semiconductor substrate. For example, a P-type semiconductor substrate may be selected for an N-type high voltage device, and an N-type semiconductor substrate may be selected for a P-type high voltage device. In the present embodiment, the semiconductor substrate 100 is a P-type semiconductor substrate.

As an example, a shallow trench isolation (STI) structure is formed in the semiconductor substrate to define an active region.

As an example, a drift region 101 is disposed in the semiconductor substrate 100.

The drift region includes different conductivity types depending on the types of the LDMOS device. For example, the drift region 101 is an N-type drift region if the LDMOS device is an N-type LDMOS device, and the drift region 101 is a P-type drift region if the LDMOS device is a P-type LDMOS device.

Typically, the doping concentration of the drift region is lower than those of the source and the drain, which is equivalent to forming a high resistance layer between the source and the drain. The high resistance layer increases the breakdown voltage and reduces the parasitic capacitance between the source and the drain, which is helpful to improve frequency characteristics.

In one example, a bulk region 102 may also be disposed in the semiconductor substrate 100. The bulk region 102 is located outside the drift region 101 and is spaced from the drift region. The bulk region and the drift region have opposite conductivity types. Specifically, the bulk region is P-type if the drift region is N-type, or the bulk region is N-type if the drift region is P-type.

As an example, a well region is further disposed in the semiconductor substrate 100, with the bulk region 102 and the drift region 101 being both disposed in the well region. The well region has the same conductivity type as the drift region 101, and the doping concentration of the well region is lower than that of the drift region 102. A part of the well region that is outside the bulk region and the drift region 102 form a drift region with a gradual doping concentration.

Other well regions can also be formed in the semiconductor substrate 100, which are not described herein.

In one example, a gate structure 103 is disposed on part of the surface of the semiconductor substrate 100.

The gate structure 103 is configured to cover a channel region (for example, a part of a surface of the bulk region 102). Additionally, the gate structure is further configured to cover a part of a surface of the drift region 101. As an example, the gate structure 103 includes a gate dielectric layer 1031 on the surface of the semiconductor substrate 100 and a gate layer 1032 on the gate dielectric layer 1031.

In an embodiment, the gate dielectric layer 1031 may include conventional dielectric materials such as oxides, nitrides, and oxynitrides of silicon having a dielectric constant from about 4 to about 20 (measured in vacuum), or the gate dielectric layer may include a dielectric material of higher dielectric constant from about 20 to at least 100. Such electrolyte materials of higher dielectric constant may include, but are not limited to, hafnium oxides, hafnium silicates, titanium oxides, barium strontium titanates (BSTs), and lead zirconate titanates (PZTs). The gate layer 1032 is made of polysilicon material. Alternatively, a metal, a metal nitride, a metal silicide, or similar compounds can also be used as the material of the gate layer. In this embodiment, the material of the gate layer 1032 includes polysilicon.

In one example, spacers 104 are formed on sidewalls of the gate structure 103. The spacers may be one of silicon oxide, silicon nitride, and silicon oxynitride, or a combination thereof.

In one example, a source 1052 and a drain 1051 are respectively disposed in the semiconductor substrate 100 on opposite sides of the gate structure 103. The drain 1051 is disposed in the drift region 101 and is spaced from the gate structure 103. The source 1052 is formed in the bulk region 102. The source 1052, the drain 1051, and the drift region 101 have the same conductivity type. For example, if the drift region is an N-type drift region, the drain and the source could be N-type too or could be heavily doped with N-type ions.

Furthermore, the drain 1051 is spaced from the spacer 104 adjacent to the drain.

In one example, a bulk region lead-out region (not shown) having the same conductivity type as the bulk region is formed in the bulk region. For example, if the bulk region is P-type, the bulk region lead-out region may also be P-type. The doping concentration of the bulk region lead-out region is greater than that of the bulk region. For example, the bulk region lead-out region is heavily doped with P-type impurities.

As an example, the surface of the drift region, the source, the drain and the surface of the bulk region are all flush with the surface of the semiconductor substrate.

In one example, the LDMOS device further includes a metal silicide blocking layer 106 configured to cover at least part of the surface of the semiconductor substrate 100 between the gate structure 103 and the drain 1051. In other words, the metal silicide blocking layer 106 is configured to cover a part of the surface of the drift region 101 between the gate structure 103 and the drain 1051.

In one example, the metal silicide blocking layer 106 is configured to cover part of the top surface of the gate structure 103 and the surface of the semiconductor substrate 100 between the gate structure 103 and the drain 1051, that is, the metal silicide blocking layer 106 is configured to cover the surface of the semiconductor substrate 100 between the gate structure 103 and the drain 1051, and extend to part of the top surface of the gate 103. In the case that spacers 104 are formed on the sidewalls of the gate structure 103, the metal silicide blocking layer 106 is further configured to cover the spacer 104 on the sidewall of the gate structure 103 adjacent to the drain.

In one example, the metal silicide blocking layer 106 includes an oxide layer, a nitride layer and a nitrogen oxide layer successively stacked from bottom to top. The oxide layer includes, for example, silicon oxide. The nitride layer includes, for example, silicon nitride. The nitrogen oxide layer includes, for example, silicon oxynitride.

As an example, the thicknesses of the nitride layer and the nitrogen oxide layer in the metal silicide blocking layer 106 are both smaller than the thickness of the oxide layer. For example, the thickness of the nitride layer can be 350~700 angstroms. The thickness of the nitrogen oxide layer can be 350~700 angstroms, and the thickness of the oxide layer can be 1000~3000 angstroms, such as 1000 angstroms, 1500 angstroms, 2000 angstroms, 2500 angstroms, 3000 angstroms and the like.

It should be noted that the metal silicide blocking layer 106 may further include other suitable materials. For example, the metal silicide blocking layer 106 may further include at least one of a silicon oxide layer, a silicon nitride layer, a silicon oxynitride layer, and a carbon-doped silicon nitride layer.

In one example, in order to reduce the contact resistance, a metal silicide layer 107 is formed on part of the surfaces of the source 1052, the drain 1051 and the gate structure 103. The metal silicide layer 107 may include materials of CoSix, NiSix, PtSix or a combination thereof.

In one example, there is a first contact hole 1081 on at least part of the surface of the metal silicide blocking layer 106. The first contact hole 1081 can be partly located on the surface of the metal silicide blocking 106 above the gate structure, partly on the surface of the metal silicide blocking 106 above the spacer, and partly on the surface of the metal silicide blocking layer 106 above the surface of the semiconductor substrate between the spacer and the drain. Alternatively, the first contact hole 1081 can be entirely located on the surface of the metal silicide blocking layer 106 above the surface of the semiconductor substrate between the spacer and the drain. Alternatively, the first contact hole 1081 can be partly located on the surface of the metal silicide blocking layer 106 above the spacer and partly on the surface of the metal silicide blocking layer 106 above the surface of the semiconductor substrate between the spacer and the drain.

In one example, the metal silicide blocking layer 106 includes an oxide layer, a nitride layer and a nitrogen oxide layer successively stacked from bottom to top. The bottom of the first contact hole 1081 is located in the nitride layer. For example, the bottom of the first contact hole 1081 is located on the surface of the nitride layer. In this way, the depletion of the electric field in the drift region can be adjusted by changing the thickness of the oxide layer under the nitride layer in the metal silicide blocking layer 106, thereby improving the characteristics of the device.

In one example, a second contact hole 1082 is disposed on part of the surface of the source 1052 and electrically coupled to the source 1052. Specifically, the second contact hole 1082 is electrically coupled to the metal silicide layer 107 on the surface of the source 1052 so as to achieve electrical coupling to the source 1052.

Further, the second contact hole 1082 and the first contact hole 1081 are electrically coupled with each other and both grounded, which can increase the depletion of the drift region and further increase the breakdown voltage of the device.

The second contact hole 1082 and the first contact hole 1081 may be electrically coupled to each other by electrically coupling to a same metal layer or a metal interconnection structure, or may be electrically coupled to each other by other suitable means.

In an example, a third contact hole 1083 is disposed on part of the surface of the drain 1051 and electrically coupled to the drain 1051. Specifically, the third contact hole 1083 is electrically coupled to the metal silicide layer 107 on the surface of the drain 1051 so as to achieve electrical coupling to the drain 1051.

In one example, the first contact hole 1081, the second contact hole 1082, and the third contact hole 1083 are filled with a conductive material, wherein the conductive material may be any suitable conductive material well known to those skilled in the art, including but not limited to metal materials. The metal materials may include one or more of Ag, Au, Cu, Pd, Pt, Cr, Mo, Ti, Ta, W, and Al.

The first contact hole 1081, the second contact hole 1082, and the third contact hole 1083 are filled with the same conductive material. For example, they may be filled with copper or the like. Alternatively, they may be filled with different conductive materials.

In one example, in order to enhance the depletion of the drift region, the width of the first contact hole 1081 is larger than those of the second contact hole 1082 and the third contact hole 1083. The widths refer to the diameters of the first contact hole 1081, the second contact hole 1082 and the third contact hole 1083 in the direction of a line between the source and drain and its extension line.

In one example, the LDMOS device further includes an interlayer dielectric layer 109 configured to cover the gate structure 103, the source 1052, the drain 1051, the metal silicide blocking layer 106 and the exposed surface of the semiconductor substrate. The first contact hole 1081 extends through part of the interlayer dielectric layer 109 above the metal silicide blocking layer 106. The second contact hole 1082 extends through part of the interlayer dielectric layer 109 above the source 1052. The third contact hole 1083 extends through part of the interlayer dielectric layer 109 above the drain 1051.

The interlayer dielectric layer 109 may be a silicon oxide layer, including a layer of doped or undoped silicon oxide material formed by a process of thermal chemical vapor deposition (CVD) or high density plasma (HDP), such as an undoped silicon glass (USG), a phosphorus silicon glass (PSG) or a boron phosphorus silicon glass (BPSG). In addition, the interlayer can also be spin-on-glass (SOG) doped with boron or phosphorus, phosphorus doped tetraethoxysilane (PTEOS) or boron doped tetraethoxysilane (BTEOS).

The main structure of the LDMOS device of the disclosure has been described above, and any other part that the device may also include will not be described here.

In summary, the LDMOS device of the present disclosure includes a metal silicide blocking layer configured to cover at least part of a surface of the semiconductor substrate between the gate structure and the drain, and a first contact hole that disposed on at least part of the surface of the metal silicide blocking layer. The depletion of the drift region is therefore enhanced to increase the breakdown voltage of the device, thereby improving the performance of the device. Further, the metal silicide blocking layer 106 includes an oxide layer, a nitride layer and a nitrogen oxide layer successively stacked from bottom to top. The bottom of the first contact hole is located in the nitride layer, for example, the bottom of the first contact hole is located on the surface of the nitride layer. In this way, the depletion of the electric field in the drift region can be adjusted by changing the thickness of the oxide layer under the nitride layer in the metal silicide blocking layer 106, thereby improving the characteristics of the device. In addition, there is no need for the LDMOS device of the present disclosure to provide any shallow trench isolation in the drift region of the drain, thereby greatly reducing the on-resistance of the device.

Embodiment II

Figure 2:
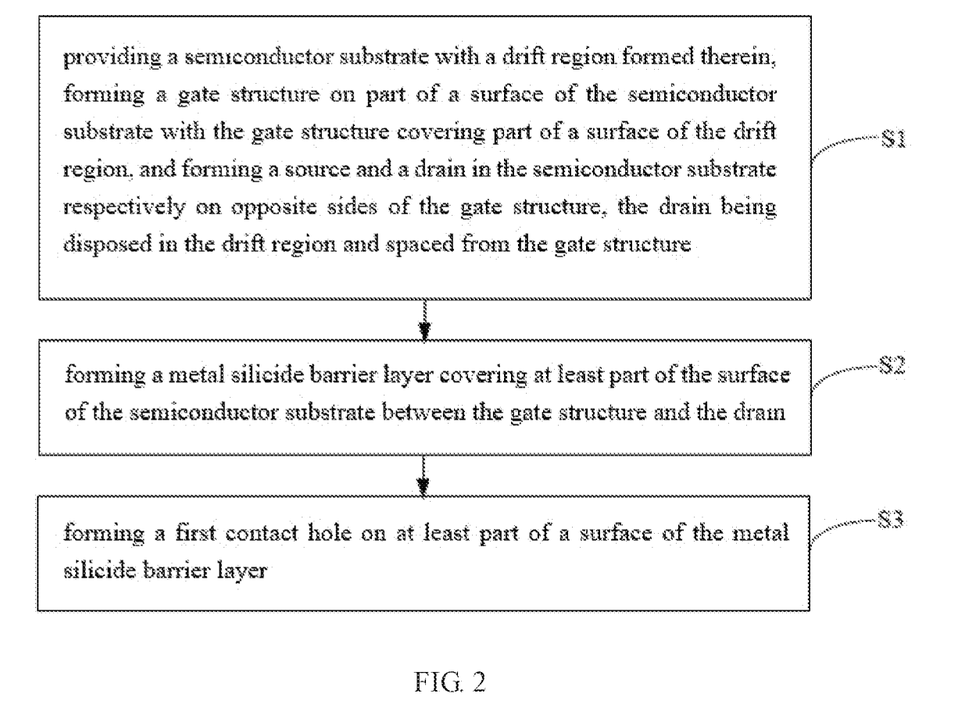
FIG. 2 shows a flowchart of a manufacturing method for an LDMOS device according to an embodiment of the present disclosure.

The present disclosure also provides a manufacturing method for an LDMOS device according to the first embodiment. As an example, as shown in FIG. 2, the manufacturing method for a semiconductor device according to the present disclosure mainly includes the following steps:

Step S1, providing a semiconductor substrate with a drift region formed therein, forming a gate structure on part of a surface of the semiconductor substrate with the gate structure being configured to cover part of a surface of the drift region, and form a source and a drain in the semiconductor substrate respectively on opposite sides of the gate structure, the drain being disposed in the drift region and spaced from the gate structure;

Step S2, providing a metal silicide blocking layer configured to cover at least part of the surface of the semiconductor substrate between the gate structure and the drain;

Step S3, providing a first contact hole on at least part of the metal silicide blocking layer.

The manufacturing method for the LDMOS device of the present disclosure is described in detail below with reference to FIGS. 1A to 1G and FIG. 2. FIGS. 1A to 1G are schematic cross-sectional views of a device obtained by the steps of a method for manufacturing an LDMOS device according to an embodiment of the present disclosure, and FIG. 2 shows a flowchart of a manufacturing method for an LDMOS device according to an embodiment of the present disclosure.

Specifically, the manufacturing method for the LDMOS device of the present disclosure includes the following steps:

First, the first step is performed to provide a semiconductor substrate with a drift region formed therein. A gate structure is formed on part of a surface of the semiconductor substrate with the gate structure being configured to cover part of a surface of the drift region. A source and a drain are formed in the semiconductor substrate respectively on opposite sides of the gate structure. The drain is disposed in the drift region and spaced from the gate structure.

Figure 1A:
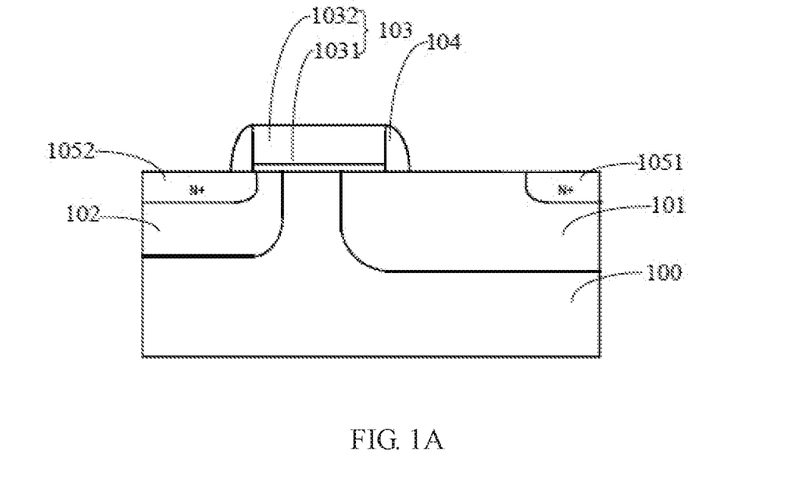
FIGS. 1A to 1G are schematic cross-sectional views of a device obtained by the steps of a manufacturing method for an LDMOS device according to an embodiment of the present disclosure.
Figure 1B:
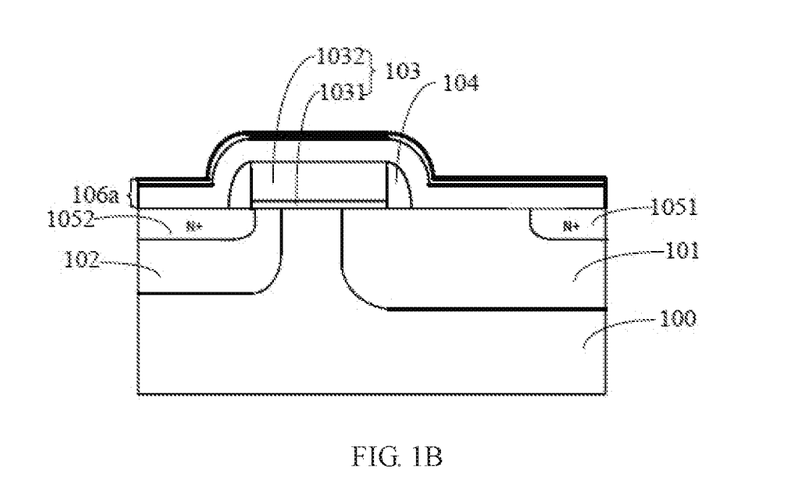

As an example, as shown in FIG. 1A, a semiconductor 100 is provided. The semiconductor substrate 100 can be made of undoped monocrystalline silicon, doped monocrystalline silicon, silicon on insulator (SOI), stacked silicon on insulator (SSOI), stacked silicon germanium on insulator (S—SiGeOI), silicon germanium on insulator (SiGeOI), and germanium on insulator (GeOI). As an example, in the present embodiment, the composition material of the semiconductor substrate 100 is monocrystalline silicon.

The semiconductor substrate 100 can also be a P-type semiconductor substrate or an N-type semiconductor substrate. For example, a P-type semiconductor substrate may be selected for an N-type high voltage device, and an N-type semiconductor substrate may be selected for a P-type high voltage device. In the present embodiment, the semiconductor substrate 100 is a P-type semiconductor substrate.

As an example, a shallow trench isolation (STI) structure is formed in the semiconductor substrate to define an active region.

As an example, a drift region 101 is disposed in the semiconductor substrate 100.

The drift region includes different conductivity types according to the types of LDMOS device. For example, if the LDMOS device is an N-type LDMOS device, the drift region 101 is an N-type drift region. If the LDMOS device is a P-type LDMOS device, the drift region 101 is a P-type drift region.

Typically, the doping concentration of the drift region is lower than those of the source and the drain, which is equivalent to forming a high resistance layer between the source and the drain. The high resistance layer increases the breakdown voltage and reduces the parasitic capacitance between the source and the drain, which is helpful to improve frequency characteristics.

The drift region 101 may be formed through a suitable method, such as an ion implantation method. For example, when manufacturing an N-type high voltage device, N-type ion doping is performed to form the N-type drift region at an area in the semiconductor substrate 100 where a drift region 101 is desired. When manufacturing a P-type high voltage device, the semiconductor substrate 100 will be doped with P-type ions to form a P-type drift region.

Doping is generally achieved by implantation. The higher the required doping concentration, the higher the implantation dose during the implantation process. Typically, the doping concentration in the drift region is relatively low, which is equivalent to forming a high resistance layer between source and drain. It can thus increase the breakdown voltage and reduce the parasitic capacitance between the source and the drain, thereby improving frequency characteristics. For example, in one embodiment of the present disclosure, the implanted impurity is phosphorus, and the implanted dose in the drift region may be $1.0 \times 10^{12} \sim 1.0 \times 10^{13}$ cm$^{-2}$.

In one example, a bulk region 102 may also be disposed in the semiconductor substrate 100. The bulk region 102 is located outside the drift region 101 and is spaced from the drift region. The bulk region and the drift region have opposite conductivity types, that is, if the drift region is N-type, the bulk region is P-type, or if the drift region is P-type, the bulk region is N-type. The bulk region 102 can also be formed by a method such as ion implantation. For example, if a P-type bulk region is predetermined, P-type dopant impurities such as boron will be doped by ion implantation into the semiconductor substrate where the bulk region is to be formed.

As an example, before forming the bulk region and the drift region, a well region is formed in the semiconductor substrate 100, and the bulk region 102 and the drift region 101 are both in the well region. The well region has the same conductivity type as the drift region 101, and the doping concentration of the well region is lower than the drift region 102. The part of the well region that is outside the bulk region and the drift region 102 form a drift region with a gradual doping concentration.

Other well regions can also be formed in the semiconductor substrate 100, and details are not described here.

It should be noted that the bulk region may be formed first, or the drift region may be formed first. The sequence is not limited here.

In one example, a gate structure 103 is disposed on part of the surface of the semiconductor substrate 100.

The gate structure 103 is configured to cover a channel region (for example, a part of a surface of the bulk region 102). Further, the gate structure is further configured to cover part of a surface of the drift region 101. As an example, the gate structure 103 includes a gate dielectric layer 1031 on the surface of the semiconductor substrate 100 and a gate layer 1032 on the gate dielectric layer 1031.

In one example, the method of forming the gate structure 103 may include the following steps: sequentially forming a gate dielectric layer and a gate layer on the semiconductor substrate 100, and patterning the gate dielectric layer and the gate layer to form gate structure 103. The gate dielectric layer 1031 may include conventional dielectric materials such as oxides, nitrides, and oxynitrides of silicon having a dielectric constant from about 4 to about 20 (measured in vacuum), or the gate dielectric layer may include a dielectric material of higher dielectric constant from about 20 to at least 100. Such electrolyte materials of higher dielectric constant may include, but are not limited to, hafnium oxides, hafnium silicates, titanium oxides, barium strontium titanates (BSTs), and lead zirconate titanates (PZTs). The gate layer 1032 is made of polysilicon material. Alternatively, a metal, a metal nitride, a metal silicide, or a similar compound can also be used as the material of the gate layer. In this embodiment, the material of the gate layer 1032 includes polysilicon.

The preferred method for forming the gate layer includes chemical vapor deposition (CVD), such as low temperature chemical vapor deposition (LTCVD), low pressure chemical vapor deposition (LPCVD), rapid thermal chemical vapor deposition (LTCVD), and plasma chemical vapor deposition (PECVD). Methods such as sputtering, physical vapor deposition (PVD) or the like can also be used. A suitable thickness of the gate layer may be selected according to the size of the device, and is not specifically limited herein.

In one example, after the formation of the gate structure, spacers 104 are selectively formed on sidewalls of the gate structure 103. The spacers may be one of silicon oxide, silicon nitride, and silicon oxynitride, or a combination thereof. As an example of this embodiment, the spacers are composed of silicon oxide and silicon nitride. Specifically, the process includes forming a first silicon oxide layer, a first silicon nitride layer, and a second silicon oxide layer on the semiconductor substrate, and then forming the spacers by etching.

As an example, ion implantation may subsequently be performed to form a bulk region lead-out region with the same conductivity type as the bulk region in the bulk region. For example, if the bulk region is P-type, the bulk region lead-out region may also be P-type. The doping concentration of the bulk region lead-out region is greater than the bulk region. For example, the bulk region lead-out region is heavily doped with P-type impurities.

In one example, a source 1052 and a drain 1051 are respectively disposed in the semiconductor substrate 100 on opposite sides of the gate structure 103. The drain 1051 is disposed in the drift region 101 and spaced from the gate structure 103. The source 1052 is formed in the bulk region 102. The source 1052, the drain 1051, and the drift region 101 have the same conductivity type. For example, if the drift region is an N-type drift region, the drain and the source could be N-type too or could be heavily doped with N-type ions.

Furthermore, the drain 1051 is spaced from the spacer 104 adjacent to the drain.

The method for forming the source and drain includes performing source/drain ion implantation on a region in the semiconductor substrate where the source and drain are to be formed, thereby forming the source and the drain in the semiconductor substrate 100 on opposite sides of the gate structure 103. Patterned photoresist layers that expose the regions where the source and the drain are to be formed can be formed first via a photolithography process. Source/drain ion implantation is then performed, during which the patterned photoresist layer acts as a mask. The patterned photoresist layer is finally removed by, for example, ashing.

Afterward, an annealing process may be performed. For example, the annealing may be performed by any annealing method known to those skilled in the art, including but not limited to rapid thermal annealing, furnace tube annealing, peak annealing, laser annealing, etc. For example, rapid thermal anneal is performed to activate the dopants in the source/drain regions at a high temperature of 900° C. to 1050° C., and the lattice structure on the surface of the semiconductor substrate damaged during each ion implantation process is repaired simultaneously. In addition, depending on product requirements and functional considerations, a lightly doped drain (LDD) may be formed between the source/drain region and each gate.

Sequentially, the second step is performed to form a metal silicide blocking layer covering at least part of the surface of the semiconductor substrate between the gate structure and the drain.

Figure 1C:
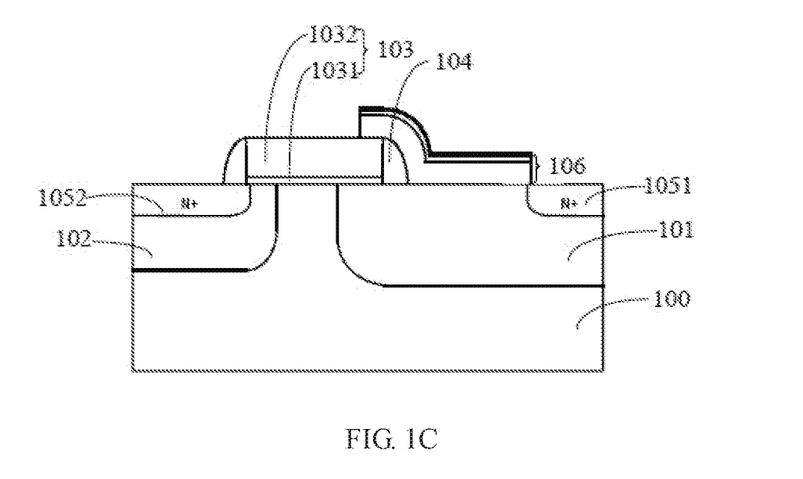

As an example, as shown in FIG. 1C, the metal silicide blocking layer 106 is configured to cover at least part of the surface of the semiconductor substrate 100 between the gate structure 103 and the drain 1051. In other words, the metal silicide blocking layer 106 is configured to cover the surface of the drift region 101 between the gate structure 103 and the drain 1051.

In one example, the metal silicide blocking layer 106 is configured to cover part of the top surface of the gate structure 103 and the surface of the semiconductor substrate 100 between the gate structure 103 and the drain 1051, that is, the metal silicide blocking layer 106 is configured to cover the surface of the semiconductor substrate 100 between the gate structure 103 and the drain 1051 and extend to part of the top surface of the gate 103. In the case that spacers 104 are formed on the sidewalls of the gate structure 103, the metal silicide blocking layer 106 is further configured to cover the spacer 104 on the sidewall of the gate structure 103 adjacent to the drain.

In one example, the metal silicide blocking layer 106 includes an oxide layer, a nitride layer and a nitrogen oxide layer successively stacked from bottom to top. The oxide layer includes, for example, silicon oxide. The nitride layer includes, for example, silicon nitride. The nitrogen oxide layer includes, for example, silicon oxynitride.

As an example, the thickness of the nitride layer and the thickness of the nitrogen oxide layer in the metal silicide blocking layer 106 are both smaller than the thickness of the oxide layer. For example, the thickness of the nitride layer can be 350~700 angstroms. The thickness of the nitrogen oxide layer can be 350~700 angstroms, and the thickness of the oxide layer can be 1000~3000 angstroms, such as 1000 angstroms, 1500 angstroms, 2000 angstroms, 2500 angstroms, 3000 angstroms and the like.

It should be noted that the metal silicide blocking layer 106 may further include other suitable materials. For example, the metal silicide blocking layer 106 may further include at least one of a silicon oxide layer, a silicon nitride layer, a silicon oxynitride layer, and a carbon-doped silicon nitride layer.

In one example, as shown in FIGS. 1B and 1C, the method for forming the metal silicide blocking layer 106 includes the following steps:

First, as shown in FIG. 1B, a metal silicide blocking material layer 106a is deposited to cover the gate structure 103, the spacers 104, the source 1052, and the drain 1051. Further, the metal silicide blocking material layer 106a is configured to cover the entire surface of the semiconductor substrate. The metal silicide blocking material layer 106a may be formed by conformal deposition such as chemical vapor deposition, physical vapor deposition, or atomic layer deposition.

Sequentially, as shown in FIG. 1C, the metal silicide blocking material layer is patterned to form the metal silicide blocking layer 106.

Specifically, a patterned mask layer, such as a patterned photoresist layer, may be formed first on the metal silicide blocking material layer, and the patterned mask layer defines a predetermined metal silicide blocking layer 106. The metal silicide blocking material layer is etched until reaching the surface of the semiconductor substrate so as to form the metal silicide blocking layer 106, during which the patterned mask layer acts as a mask. Dry etching, wet etching and other methods can be used during the process to etch the metal silicide blocking material layer. The patterned mask layer is removed finally.

The resulted metal silicide blocking layer 106 exposes part of a top surface of the gate structure, a surface of the drain, and a surface of the source, so as to facilitate the subsequent formation of the metal silicide.

Subsequently, a metal silicide layer is formed on the exposed surfaces of the gate structure, the source and the drain.

Figure 1D:
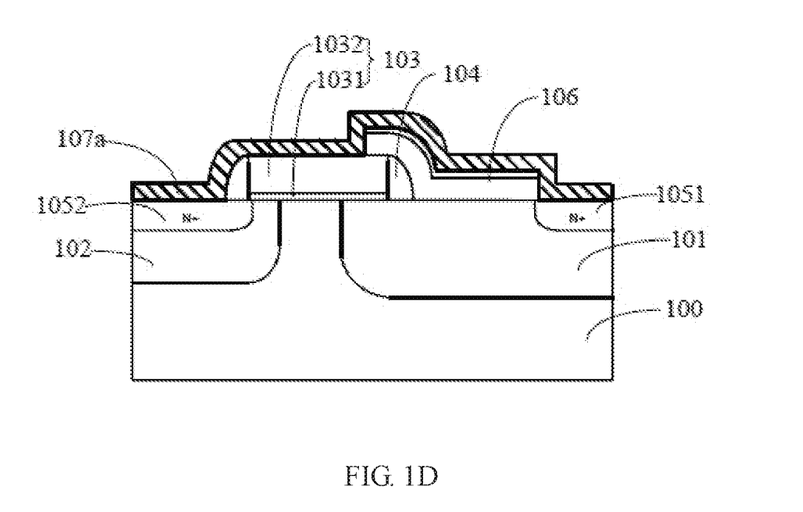

In one example, as shown in FIG. 1D, in order to reduce the contact resistance, a metal silicide layer 107 is formed on part of the surfaces of the source 1052, the drain 1051 and the gate structure 103. The metal silicide layer 107 may include materials of CoSix, NiSix, PtSix or a combination thereof.

Figure 1E:
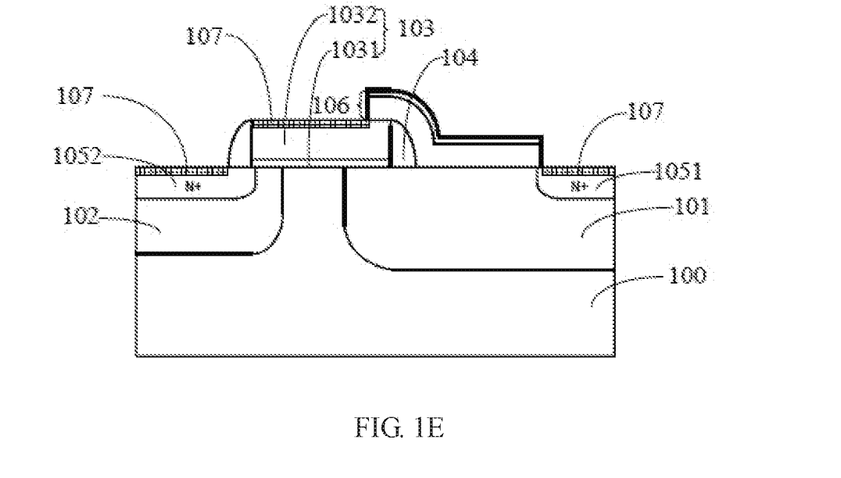

In one example, as shown in FIGS. 1D to 1E, the method for forming the metal silicide layer 107 includes the following steps: First, as shown in FIG. 1D, a metal layer 107a may be deposited, which may include nickel, cobalt, platinum or combinations thereof. The substrate is then heated, causing the metal layer to silicify with the silicon layer below it, and the region of the metal silicide layer 107 is thus formed. An etchant that can erode the metal layer but does not erode the region of the metal silicide layer is then used to remove the unreacted metal layer.

Subsequently, an interlayer dielectric layer is formed to cover the gate structure 103, the source 1052, the drain 1051, and the metal silicide blocking layer 106.

Figure 1F:
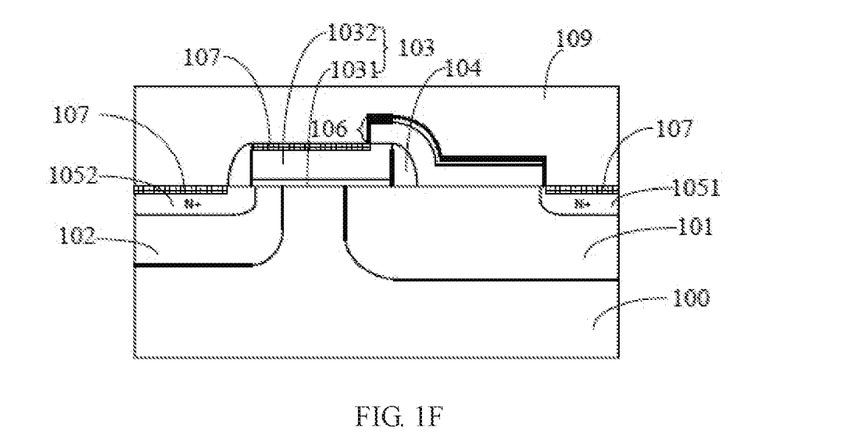
Figure 1G:
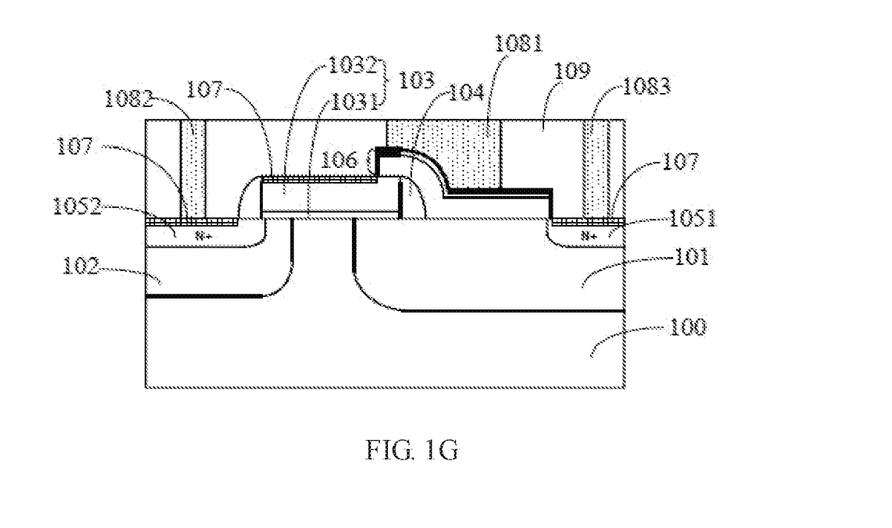

Specifically, as shown in FIG. 1F, an interlayer dielectric layer 109 is formed to cover the gate structure 103, the source 1052, the drain 1051 and the metal silicide blocking 106. In other words, the interlayer dielectric layer is configured to cover the entire exposed surface of the semiconductor substrate, the gate structure 103, the source 1052, the spacers 104, the drain 1051 and the metal silicide blocking layer 106.

The interlayer dielectric layer 109 may be a silicon oxide layer, including a layer of doped or undoped silicon oxide material formed by a process of thermal chemical vapor deposition (CVD) or high density plasma (HDP), such as an undoped silicon glass (USG), a phosphorus silicon glass (PSG) or a boron phosphorus silicon glass (BPSG). In addition, the interlayer can also be spin-on-glass (SOG) doped with boron or phosphorus, phosphorus doped tetraethoxysilane (PTEOS) or boron doped tetraethoxysilane (BTEOS).

As an example, the deposited interlayer dielectric layer 109 may also be flattened by a flattening method (for example, chemical mechanical polishing), so that the interlayer dielectric layer 109 has a flat surface.

The third step is performed subsequently. A first contact hole is formed on at least part of the surface of the metal silicide blocking layer.

Specifically, as shown in FIG. 1, a first contact hole 1081 is formed on at least part of the surface of the metal silicide blocking layer 106.

In one example, the step of forming the first contact hole further includes the following steps:

Forming a second contact hole 1082 on part of the surface of the source 1052, the second contact hole 1082 being electrically coupled to the source 1052;

Forming a third contact hole 1083 on part of the surface of the drain 1051, the third contact hole 1083 being electrically coupled to the drain 1051.

In one example, a method of forming the first contact hole, the second contact hole, and the third contact hole includes the following steps:

First, a patterned mask layer (for example, a patterned photoresist layer) is formed first on the surface of the interlayer dielectric layer 109. The patterned mask layer defines the predetermined patterns and positions of the first contact hole, the second contact hole and the third contact hole.

Sequentially, the interlayer dielectric layer is etched using the patterned mask layer as a mask to form the first contact hole, the second contact hole, and the third contact hole, respectively. When forming the first contact hole, the etching can be stopped when reaching the nitride layer in the metal silicide blocking layer 106. That is, the etching stops at the surface of the nitride layer. The metal silicide blocking layer 106 includes an oxide layer, a nitride layer and a nitrogen oxide layer successively stacked from bottom to top, out of which the nitride layer and the nitrogen oxide layer can be used as an etch stop layer. Thus, it can ensure that the first contact hole will not extend into the semiconductor substrate but stop at the nitride layer during the etching process. The second contact hole and the third contact hole stop on the surface of the semiconductor substrate during etching.

Afterward, the patterned mask layer can be removed using methods well known to those skilled in the art.

Subsequently, the formation of the first contact hole 1081, the second contact hole 1082 and the third contact hole 1083 is finally completed by filling a conductive material thereto. The conductive material may be any suitable conductive material well known to those skilled in the art, including but not limited to metal materials. The metal materials may include one or more of Ag, Au, Cu, Pd, Pt, Cr, Mo, Ti, Ta, W, and Al.

The first contact hole 1081, the second contact hole 1082, and the third contact hole 1083 are filled with the same conductive material. For example, they may be filled with copper or the like. Alternatively, they may be filled with different conductive materials.

In one example, there is a first contact hole 1081 on at least part of the surface of the metal silicide blocking layer 106. The first contact hole 1081 can be partly located on the surface of the metal silicide blocking 106 above the gate structure, partly on the surface of the metal silicide blocking 106 above the spacer, and partly on the surface of the metal silicide blocking layer 106 above the surface of the semiconductor substrate between the spacer and the drain. Alternatively, the first contact hole can be entirely located on the surface of the metal silicide blocking layer 106 above the surface of the semiconductor substrate between the spacer and the drain. Alternatively, the first contact hole can be partly located on the surface of the metal silicide blocking layer 106 above the spacer and partly on the surface of the metal silicide blocking layer 106 above the surface of the semiconductor substrate between the spacer and the drain.

In one example, the metal silicide blocking layer 106 includes an oxide layer, a nitride layer and a nitrogen oxide layer successively stacked from bottom to top. The bottom of the first contact hole 1081 is located in the nitride layer, for example, the bottom of the first contact hole 1081 is located on the surface of the nitride layer. In this way, the depletion of the electric field in the drift region can be adjusted by changing the thickness of the oxide layer under the nitride layer in the metal silicide blocking layer 106, thereby improving the characteristics of the device.

In one example, a second contact hole 1082 is disposed on part of the surface of the source 1052 and electrically coupled to the source 1052. Specifically, the second contact hole 1082 is electrically coupled to the source 1052 by virtue of electrically coupling to the metal silicide layer 107 on the surface of the source 1052.

Further, the second contact hole 1082 and the first contact hole 1081 are electrically coupled to each other and grounded, which increases the depletion of the drift region and further increases the breakdown voltage of the device.

The second contact hole 1082 and the first contact hole 1081 may be electrically coupled to each other by electrically coupling to a same metal layer or a metal interconnection structure, or may be electrically coupled to each other by other suitable means.

In an example, a third contact hole 1083 is disposed on part of the surface of the drain 1051 and electrically coupled to the drain 1051. Specifically, the third contact hole 1083 is electrically coupled to the metal silicide layer 107 on the surface of the drain 1051 so as to achieve electrical coupling to the drain 1051.

In one example, in order to enhance the depletion of the drift region, the width of the first contact hole 1081 is larger than those of the second contact hole 1082 and the third contact hole 1083. The widths refer to the diameters of the first contact hole 1081, the second contact hole 1082 and the third contact hole 1083 in the direction of a line between the source and drain and its extension line.

In one example, the first contact hole 1081 extends through part of the interlayer dielectric layer 109 above the metal silicide blocking layer 106. The second contact hole 1082 extends through part of the interlayer dielectric layer 109 above the source 1052. The third contact hole 1083 extends through part of the interlayer dielectric layer 109 above the drain 1051.

The main steps of the manufacturing method for the LDMOS device of the disclosure have been described above, and any other step that the process of manufacturing an entire device may also involve will not be described in detail here.

In summary, the LDMOS device of the present disclosure includes a metal silicide blocking layer configured to cover at least part of a surface of the semiconductor substrate between a gate structure and the drain, and a first contact hole disposed on at least part of a surface of the metal silicide blocking layer. Therefore, the depletion of the drift region is enhanced to increase the breakdown voltage of the device, thereby improving the performance of the device. Further, the metal silicide blocking layer 106 includes an oxide layer, a nitride layer and a nitrogen oxide layer successively stacked from bottom to top. The bottom of the first contact hole 1081 is located in the nitride layer, for example, the bottom of the first contact hole 1081 is located on the surface of the nitride layer. In this way, the depletion of the electric field in the drift region can be adjusted by changing the thickness of the oxide layer under the nitride layer in the metal silicide blocking layer 106, thereby improving the characteristics of the device. In addition, there is no need for the LDMOS device of the present disclosure to provide any shallow trench isolation in the drift region of the drain, thereby greatly reducing the on-resistance of the device. Furthermore, the process of the present disclosure is simple and easy to control, since it does not need any additional photomask, nor does it involve any step of reusing such photomask.

Embodiment III

The present disclosure also provides an electronic apparatus including the LDMOS device according to the first embodiment, and the LDMOS device is prepared according to the method described in the second embodiment.

The electronic apparatus in this embodiment may be any electronic product or electronic equipment such as a mobile phone, a tablet computer, a notebook computer, a netbook computer, a game console, a television, a VCD, a DVD, a navigator, a digital photo frame, a camera, a video camera, a voice recorder, MP3, MP4, PSP, etc., or any intermediate product with a circuit. The electronic apparatus according to the embodiment of the present disclosure has better performance as the LDMOS device described above is used.

Figure 3:
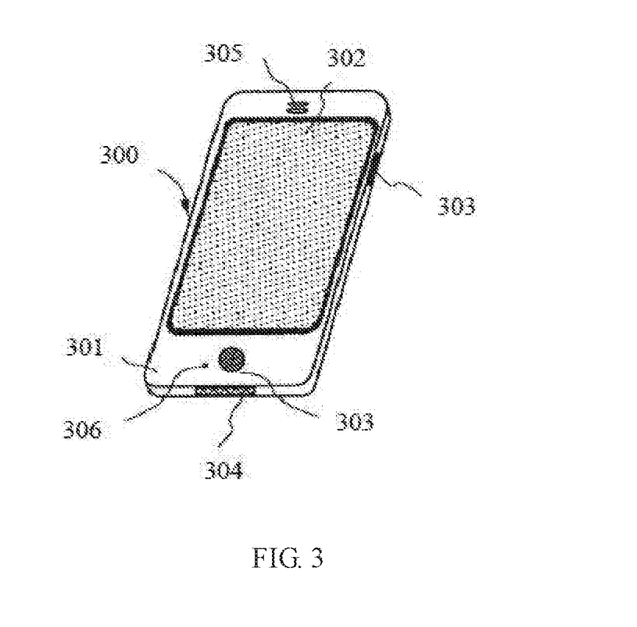
FIG. 3 is a schematic diagram of an electronic apparatus according to an embodiment of the disclosure.

FIG. 3 shows an example of a mobile phone. The mobile phone 300 is equipped with a display 302, operation buttons 303, an external connection port 304, a speaker 305, a microphone 306, and the like enclosed within a housing 301.

The mobile phone includes the LDMOS device according to the first embodiment, and the LDMOS device includes: a semiconductor substrate; a drift region disposed in the semiconductor substrate; a gate structure disposed on part of a surface of the semiconductor substrate and configured to cover part of a surface of the drift region; a source and a drain respectively disposed in the semiconductor substrate on opposite sides of the gate structure, the drain being disposed in the drift region and spaced from the gate structure; a metal silicide blocking layer configured to cover at least part of the surface of the semiconductor substrate between the gate structure and the drain; and a first contact hole disposed on at least part of a surface of the metal silicide blocking layer.

The technical features of the embodiments described above can be flexibly combined. In order to simplify the description, the above description has not covered all possible combinations of the technical features in the above embodiments. However, as long as there is no contradiction in the combinations of these technical features, it should be considered as being included within the scope described in this specification.

The above embodiments have shown only a couple of implementation manners of the present disclosure. Though the description thereof is relatively specific and detailed, it cannot be understood as the limitations of the scope of the disclosure. It should be noted that, those of ordinary skill in the art, without departing from the concept of the present disclosure, are able to make modifications and improvements to the embodiments, which also belong to the protection scope of the present disclosure. Therefore, the protection scope of the present disclosure shall be subject to the appended claims.

The invention claimed is:

1. A laterally diffused metal oxide semiconductor (LDMOS) device, comprising:
   a semiconductor substrate;
   a drift region disposed in the semiconductor substrate;
   a gate structure disposed on part of a surface of the semiconductor substrate and configured to cover part of a surface of the drift region;
   a source and a drain respectively disposed in the semiconductor substrate on opposite sides of the gate structure, the drain being disposed in the drift region and spaced from the gate structure;
   a metal silicide blocking layer configured to cover at least part of the surface of the semiconductor substrate between the gate structure and the drain; and
   a first contact hole disposed on at least part of a surface of the metal silicide blocking layer;
   wherein the metal silicide blocking layer comprises an oxide layer, a nitride layer and a nitrogen oxide layer successively stacked from bottom to top, and a bottom side of the first contact hole is located on a surface of the nitride layer; each of the nitride layer and the nitrogen oxide layer has a smaller thickness than that of the oxide layer.

2. The LDMOS device according to claim 1, wherein the metal silicide blocking layer is configured to cover part of a top surface of the gate structure and the surface of the semiconductor substrate between the gate structure and the drain.

3. The LDMOS device according to claim 1, further comprising:
   a second contact hole disposed on part of a surface of the source and electrically coupled to the source; and
   a third contact hole disposed on part of a surface of the drain and electrically coupled to the drain.

4. The LDMOS device according to claim 3, wherein the first contact hole has a greater width than those of the second contact hole and the third contact hole.

5. The LDMOS device according to claim 3, wherein the first contact hole and the second contact hole are electrically coupled to each other and are both grounded.

6. The LDMOS device according to claim 3, further comprising:
   an interlayer dielectric layer configured to cover the gate structure, the source, the drain and the metal silicide blocking layer, the first contact hole extending through part of the interlayer dielectric layer above the metal silicide blocking layer, the second contact hole extending through part of the interlayer dielectric layer above the source, and the third contact hole extending through part of the interlayer dielectric layer above the drain.

7. The LDMOS device according to claim 1, further comprising:
   a spacer disposed on a side wall of the gate structure and spaced from the drain.

8. A manufacturing method for an LDMOS device, comprising:
   providing a semiconductor substrate with a drift region formed therein, forming a gate structure on part of a surface of the semiconductor substrate with the gate structure being configured to cover part of a surface of the drift region, and form a source and a drain in the semiconductor substrate respectively on opposite sides of the gate structure, the drain being disposed in the drift region and spaced from the gate structure;
   forming a metal silicide blocking layer configured to cover at least part of the surface of the semiconductor substrate between the gate structure and the drain; and
   forming a first contact hole on at least part of a surface of the metal silicide blocking layer;
   wherein the metal silicide blocking layer comprises an oxide layer, a nitride layer and a nitrogen oxide layer successively stacked from bottom to top, and a bottom side of the first contact hole is located on a surface of the nitride layer, each of the nitride layer and the nitrogen oxide layer has a smaller thickness than that of the oxide layer.

9. The manufacturing method according to claim 8, wherein the metal silicide blocking layer is configured to cover part of a top surface of the gate structure and a surface of the semiconductor substrate between the gate structure and the drain.

10. The manufacturing method according to claim 8, wherein the step of forming the metal silicide blocking layer comprises:
    depositing and forming a metal silicide blocking material layer to cover the gate structure, the source and the drain; and
    patterning the metal silicide blocking material layer to form the metal silicide blocking layer.

11. The manufacturing method according to claim 8, wherein the step of forming the first contact hole further comprises:
    forming a second contact hole on part of a surface of the source, the second contact hole being electrically coupled to the source;
    forming a third contact hole on part of a surface of the drain, and the third contact hole being electrically coupled to the drain.

12. The manufacturing method according to claim 11, wherein the first contact hole has a greater width than those of the second contact hole and the third contact hole.

13. The manufacturing method according to claim 11, wherein the first contact hole and the second contact hole are electrically coupled to each other and are both grounded.

14. The manufacturing method according to claim 11, further comprising:
    after forming the metal silicide blocking layer and prior to forming the first contact hole, forming an interlayer dielectric layer configured to cover the gate structure, the source, the drain and the metal silicide blocking layer, the first contact hole extending through part of the interlayer dielectric layer above the metal silicide blocking layer, the second contact hole extending through part of the interlayer dielectric layer above the source, and the third contact hole extending through part of the interlayer dielectric layer above the drain.

15. The manufacturing method according to claim 8, further comprising:
    after forming the gate structure on part of the surface of the semiconductor substrate, forming a spacer on a sidewall of the gate structure, the spacer being spaced from the drain.

16. An electronic apparatus comprising an LDMOS device comprising:
    a semiconductor substrate;
    a drift region disposed in the semiconductor substrate;
    a gate structure disposed on part of a surface of the semiconductor substrate and configured to cover part of a surface of the drift region;
    a source and a drain respectively disposed in the semiconductor substrate on opposite sides of the gate structure, the drain being disposed in the drift region and spaced from the gate structure;

a metal silicide blocking layer configured to cover at least part of the surface of the semiconductor substrate between the gate structure and the drain; and a first contact hole disposed on at least part of a surface of the metal silicide blocking layer;

wherein the metal silicide blocking layer comprises an oxide layer, a nitride layer and a nitrogen oxide layer successively stacked from bottom to top, and a bottom side of the first contact hole is located on a surface of the nitride layer; each of the nitride layer and the nitrogen oxide layer has a smaller thickness than that of the oxide layer.

* * * * *